United States Patent [19]

Draheim et al.

[11] Patent Number: 4,719,504
[45] Date of Patent: Jan. 12, 1988

[54] METHOD FOR CONVERTING AN ANALOG PICTURE SIGNAL INTO AN AMPLITUDE-DISCRETE OUTPUT SIGNAL

[75] Inventors: Peter E. Draheim; Walter H. Demmer; Otto L. Warmuth, all of Hamburg, Fed. Rep. of Germany

[73] Assignee: U.S. Philips Corporation, New York, N.Y.

[21] Appl. No.: 589,432

[22] Filed: Mar. 14, 1984

[30] Foreign Application Priority Data

Mar. 14, 1983 [DE] Fed. Rep. of Germany ....... 3309080

[51] Int. Cl.⁴ ...................... H04N 11/04; H04N 9/65; H04N 9/66
[52] U.S. Cl. ........................................ 358/13; 358/23; 358/21 R; 382/50; 382/52
[58] Field of Search ....................... 358/13, 23, 21 R; 382/50, 51, 52, 53

[56] References Cited

U.S. PATENT DOCUMENTS

| | | |
|---|---|---|
| 4,352,123 | 9/1982 | Flamm .................................. 358/23 |
| 4,468,703 | 8/1984 | Fujiwara et al. ................. 382/51 X |
| 4,525,747 | 6/1985 | Sakai et al. ........................ 382/52 X |
| 4,539,600 | 9/1985 | Takahashi et al. ............... 382/50 X |
| 4,566,125 | 1/1986 | Clunn ................................. 382/52 X |
| 4,578,715 | 3/1986 | Yamaguchi ...................... 382/53 X |

Primary Examiner—James J. Groody
Assistant Examiner—E. Anne Faris
Attorney, Agent, or Firm—Thomas A. Briody; William J. Streeter; Gregory P. Gadson

[57] ABSTRACT

In a circuit arrangement for converting an analog picture signal, which corresponds to consecutive fields, into an amplitude-discrete output signal, which, in a comparison stage, compares the picture signal to a plurality of reference values and produces an amplitude-discrete intermediate signal at an output, a significant simplification of the circuit cost and design effort is accomplished with, at the same time, an improvement in the error cancellation by the fact that the change in the positions of the values of the picture signal and the reference values relative to each other corresponds to the sum of a fraction and a first integral number of value intervals.

8 Claims, 2 Drawing Figures

METHOD FOR CONVERTING AN ANALOG PICTURE SIGNAL INTO AN AMPLITUDE-DISCRETE OUTPUT SIGNAL

BACKGROUND OF THE INVENTION

The invention relates to a method for converting an analog picture signal, corresponding to consecutive fields, into an amplitude discrete output signal, comprising comparing the picture signal with a plurality of equispaced reference values having value intervals between them, producing, at an output, an amplitude-discrete intermediate signal which denotes the value interval in which the value of the picture signal is located, periodically changing the positions of the picture signal, on the one hand, and the reference values, on the other hand, relative to each other by a fraction of a value interval, and, on a picture display device, generating an optical value which corresponds to the average value of the amplitude-discrete output signal formed from the average value of the intermediate signal values of mutually corresponding picture elements.

The German Offenlegungsschrift 30 15 141, corresponding to U.S. Pat. No. 4,352,123, discloses a color television receiver comprising an analog-to-digital converter, to whose analog input a composite color signal is applied and which, from the amplitude thereof, forms a parallel binary word as an output signal. The output signal is inter alia applied to a shift register arrangement producing a delay equal to the line period of the color television picture. In addition, the color television receiver comprises a binary computer stage which forms the arithmetic mean from the input and output signals of the shift register arrangement. Because of the high frequency values to be processed, the analog-to-digital converter is in the form of a parallel-analog-to-digital converter. To reduce the cost of such an analog-to-digital converter by 50%, without affecting the digital resolution, either the reference voltage applied to the analog-to-digital converter or the input signal are shifted, for the duration of each second line, by the voltage corresponding to the value of half-a-bit of the parallel binary word, when the parallel binary word of the highest value which is capable of being displayed, corresponds to the reference voltage.

In principle, the prior art arrangement is obviously based on the recognition that the digital resolution of an analog-to-digital converter, in which an analog signal, for example an analog picture signal, is compared with a plurality of equispaced reference values, can be enhanced because of the fact that the analog signal is compared with the reference values in several consecutive (comparison) steps, that between each of these two steps either the reference value or the analog signal are shifted through a portion of the value interval between two reference values without changing their relative distances, and that the amplitude-discrete intermediate signals comprised in the relevant steps are averaged. For example, a value of the analog signal can be compared in two steps with the reference values, the analog signal and the reference values being shifted relative to each other through half-a-value interval between the two steps. If then the average value of the amplitude-discrete intermediate signal values obtained in the two steps is formed, this will provide an indication whether the value of the analog signal is located in the lower or in the upper half of the relevant value interval. When the reference values, or the value intervals, are sequentially numbered with a binary number, halving the value interval as described above is equal to extending the binary number by one position, or equal to doubling the resolution of the analog-to-digital converter. Similarly, a finer sub-division of the value intervals is alternatively possible, namely when the number of steps effected to obtain a value of the analog signal is increased and the shift between the analog signal, on the one hand, and the reference values, on the other hand, is made finer accordingly. Generally, for one value of the analog signal, an (second) integral number of comparison steps are effected; between each two comparison steps, the analog and the reference values are shifted relative to each other over a value which corresponds to a fraction of a value interval, more specifically, a value interval multiplied by the reciprocal of this (second) integer.

In principle, acting thus, an optionally fine subdivision of the value intervals of the analog-to-digital converter is possible. Using such an analog-to-digital converter of a simple construction whose reference values are spaced apart by comparatively large value intervals, a very fine resolution can ultimately be obtained in this way. This procedure has the disadvantage, in addition to the increasing overall duration of digitizing an analog signal because of the increasing number of comparison steps, that the results of all the comparison steps must be stored intermediately and be linked together by an external computer. Moreover, to accelerate the total procedure, a comparatively high switching frequency is required for shifting the reference values or the analog signal, respectively, which may cause transients and consequently invalidate the result of the analog-to-digital conversion.

The circuit arrangement disclosed in the German Offenlegungsschrift No. 30 15 141 (U.S. Pat. No. 4,352,123) has the disadvantage that the reference voltage, or the input signal, are shifted with a comparatively high switching frequency. As analog signals are processed and a very accurate setting of the desired voltages is necessary, very expensive circuit arrangements are required therefor, for example, to suppress overshoot.

The German Offenlegungsschrift No. 28 43 706, corresponding to U.K. Patent Specification No. 2,006,569, discloses a comparison stage of the type set forth in the opening paragraph in which the position of the reference values for the odd fields is changed by half the distance between two adjacent reference values relative to the position of the reference values for the even fields. This results in the switching frequency for shifting the reference voltage relative to the input signal being reduced to the field frequency.

A further disadvantage of the circuit arrangement described in the German Offenlegungsschrift No. 30 15 141 (U.S. Pat. No. 4,352,123) is that errors in the analog-to-digital converter become manifest in a very distracting manner. Thus, it may happen that a reference value occupies an incorrect position. Particularly when an area having a slightly varying luminance or color is displayed on the picture display device, such an error produces continuous, perpendicular, sudden changes in the color or the luminance.

SUMMARY OF THE INVENTION

In contrast therewith, it is an object of the invention to provide a method as set forth in the opening paragraph which, on the one hand, renders it possible to use a simplified parallel analog-to-digital converter without losses in the desired digital resolution, without the need for additional expensive circuitry in other positions in the circuit arrangement, while simultaneously improving the cancelling of errors in the analog-to-digital conversion.

According to the invention, this object is accomplished in that the change in position of the values of the picture signal and the reference values relative to each other corresponds to the sum of the fraction and a first integral number of value intervals.

For a picture signal corresponding to a sequence of picture elements, it is possible, instead of effecting a plurality of comparison steps between the value of the picture signal and a picture element, to utilize the fact that the luminance and color of adjacent picture elements—arranged one after the other in a line or next to each other in two adjacent lines—deviate only very little from each other, and consequently it is possible to perform the method such that for each picture element, only one comparison step is effected and that subsequent thereto, an averaging operation is effected on adjacent picture elements, which keeps the repetition rate of the comparison steps and consequently the shifts of the analog picture signal and the reference values relative to each other within limits.

Furthermore, according to the invention, the position of the values of the picture signal relative to the reference values between two comparison steps are changed in addition to the described shift over a (first integral) number of value intervals. With an otherwise unchanged function of the arrangement according to the invention, this measure accomplishes an improvement in the cancellation of errors in the analog-to-digital converter, more specifically of errors produced by an incorrect position of a reference value and which, as described above, result in sudden continuous, perpendicular changes in the color or in the luminance. If, as in the present state of the art, the positions of the reference values relative to the values of the picture are only shifted between two consecutive lines or fields over a fraction of a value interval, the places in which these errors become manifest in the picture remain, in essence, in the same place. Consequently the sudden continuous, perpendicular changes in the color or luminance remain. If, in contrast therewith, the positions of the values of the picture signal relative to the reference values are, in addition, shifted according to the invention over one or a plurality of value intervals, the sudden luminance or color changes, respectively, in each line of the picture are moved to a different position and consequently disappear in the overall picture impression.

It has been found that when digitizing a picture signal, more specifically a color television picture signal, significant simplifications and improvements can be developed from the fact that the picture signal corresponds to consecutive fields which overlap line-sequentially. As a result thereof, mutually corresponding picture elements of consecutive fields will always be situated in different adjacent positions of the picture. Taking the mean of always adjacent picture elements can consequently be effected by averaging mutually corresponding picture elements of consecutive fields. The position of the values of the analog picture signal is then shifted in accordance with a further embodiment of the invention relative to the reference values between two fields. As the field repetition rate of customary picture signals is very low and their vertical blanking interval is relatively lost, it is possible, without any particular circuit cost, to shift the analog picture signal or the reference values between two fields, without producing transient phenomena on the picture display device. The shift can be directly controlled by the vertical synchronizing pulses of the picture signal.

Changing the position of the values of the picture signal relative to the reference value between two fields has a still further advantage. As in a first field, the odd lines and in a second field, the even lines of the whole picture are transmitted, in the circuit arrangement of German Offenlegungsschrift No. 30 15 141 (U.S. Pat. No. 4,532,123) the position of the reference values relative to the analog picture signal for the first line is shifted with respect to the position of the reference values relative to the analog picture signal for the third line and this position is shifted with respect to the position of the reference values relative to the analog picture signal for the fifth line, etc. Similarly, in the second field, the reference values for the second line will be shifted relative to the analog picture signal with respect to those of the fourth line etc. In the complete picture, the position of the reference values relative to the analog picture signal will consequently be equal to each other for always two adjacent lines. Two adjacent lines are accentuated by such a pairing operation and averaging over lines having different positions is made more difficult. When the reference values are shifted with respect to the analog picture signal between always two fields, all lines of a field have however mutually equal reference values. As a result thereof, two adjacent lines have reference values which are shifted relative to each other. This improves taking the mean value.

In the circuit arrangements described so far, it is necessary to provide a very bulky shift register arrangement and a binary arithmetic stage to average the amplitude-discrete intermediate signals, for example, when their values are available as parallel binary words, as a counter measure to the reduction of the costs of the analog-to-digital converter. In the worst case, these measures may increase, instead of reduce, the overall cost of the circuit, as the shift register arrangement which must store all the parallel binary words of a television picture line or of a field, is very expensive.

Consequently, in accordance with a further embodiment of the invention, the intermediate signal is applied to the picture display device and by the superpositioning of at least a number of fields equal to the amount of the second integral number, is averaged in the picture display arrangement which forms the averaging device.

In the foregoing, it has already been described that the picture signal corresponds to consecutive, line-sequentially overlapping fields. As a result thereof mutually corresponding picture elements of consecutive fields may directly overlap each other in the picture display arrangement. The overlap effects an averaging of the luminances of the individual picture elements. Therefore, according to the invention, the averaging operation between two adjacent picture elements of two adjacent lines, which averaging operation increases the digital resolution, is not effected until the picture is displayed on the picture display arrangement. As a result thereof, separate devices, such as they are available in the state of the art for the electrically overlap and averaging of picture signal values corresponding to the individual picture elements, may be omitted, so that a significant simplification of the overall circuit arrangement is reached. With such an implementation of the invention, the values of the amplitude-discrete output signal are directly produced as optical values in the picture display arrangement.

According to the invention, it is further possible to superimpose mutually corresponding picture elements from more than two fields, that it is to say more specifically, from two or more consecutive pictures. Then the fact is utilized that mutually corresponding picture elements of two consecutive pictures differ, as a rule, only little from each other. For such an increase of the resolution, effected by means of an "averaging in the depth of the time", a picture display arrangement with storage feature can advantageously be used, for example, a picture tube having a picture screen with increased persistence.

For the case in which a circuit arrangement of type set forth in the opening paragraph comprises already for other purposes, a storage arrangement for the intermediate storage of at least one field, such a storage arrangement can also be used in combination with an averaging arrangement for the superimposition of fields before applying the intermediate signal to the picture display arrangement. According to an embodiment of the invention, each fraction of a value interval corresponds to the reciprocal of the second integral number of value intervals. The value intervals of the analog-to-digital converter are then sub-divided into equal portions.

According to a further embodiment of the invention, the first integral number is at least equal to two in accordance with an additional change of the position of the values of the picture signal relative to the reference values by at least two value intervals. This results in an adequate wide spread of the described errors in the analog-to-digital converter over the luminance or color gradations, respectively, and consequently also over the picture areas.

According to a still further embodiment of the invention, averaging is effected over an even number of fields. The averaging operation is more specifically effected over two fields. This ensures that the content of several consecutive pictures, or more specifically within a picture, is averaged in a defined manner.

According to another embodiment of the invention, the value of the intermediate signal is changed before the averaging operation is effected by the value of an amplitude-discrete correction signal which corresponds to the associated change in the relative position of picture signal and reference values, in the same sense as the change in the position of the reference values relative to the picture signal.

At, for example, the superpositioning of a first and a second field of a color television signal, the mutually corresponding picture elements to be superimposed are situated adjacent to each other and not over each other and are only combined to a point of resultant luminance by the optical impression specifically on the human eye. If now, as described above, the position of the values of the picture signals is changed between the two fields relative to the reference values by several value intervals, an increased difference in luminance is obtained between the picture elements of the first and second fields, which difference becomes manifest as a contrast in the shape of a line-scanning raster when the picture is viewed on the picture display arrangement.

It is therefore adequate to correct, by adding an amplitude-discrete correction signal to the intermediate signal, the change effected in the position of the value of the picture signal relative to the reference values before the analog-to-digital conversion, in such manner that the difference in luminance between adjacent picture elements of different fields corresponds to not more than one value interval. This implicates that the intermediate signal values corresponding to consecutive fields are the same as in the case in which the first integral number is chosen to be equal to zero and, consequently, the position of the picture signal value relative to the reference values between the two fields is changed only a fraction of the value interval, with one exception: when one reference value fails to appear, the consequent increased sudden changes in the luminance which, as already described in the foregoing, become visible in a distracting manner, particularly when an area in which the luminance changes slowly and steadily in the line direction is displayed, are moved relative to each other from line to line by the first integral number of value intervals and consequently blend into the displayed picture.

According to a further development of the invention, the correction signal is formed from the change in the intermediate signal effected by the change in the relative position of the picture signal and the reference values and is linked to the intermediate signal in a clamping circuit which is known per se. The correction signal is directly derived from the intermediate signal, which results in a particularly simple adaptation of the correction signal to the instantaneous changes of the intermediate signal.

According to a still further development of the invention, the correction signal comprises a plurality of predetermined values corresponding to the change in the relative position of the picture signal and the reference values, which are switched in accordance with this change. If the correction signal occupies only few predetermined values in the adequate conversion of picture signals in the circuit arrangement, this further development provides a simple possibility of producing the correction signal.

Adding the amplitude-discrete correction signal to the intermediate signal can, for example, alternatively be effected by means of an adder circuit which is controlled at the same frequency. This provides an advantageous compromise in that the value of the first integer is chosen to be equal to two. Namely, with an increased change in the position of the values of the picture signals relative to the reference values, the value range for the amplitude-discrete intermediate signal were unnecessarily increased, while with a smaller change the disturbances described in the foregoing cannot be adequately masked.

According to a further extension of the invention, a change signal which changes between every two fields is superimposed on the picture signal to change the position of the reference values and the picture signal relative to each other. The reference values may then have a fixed predetermined value, and an analog, squarewave signal of the field frequency is preferably added to the picture signal.

According to another embodiment of the invention, a change signal which changes between every two fields is superimposed on the reference values to change the position of the reference values and the picture signal relative to each other. In this case, the analog picture signal is not affected. The reference values are advantageously derived from different reference sources which are alternatively connectable to the comparison stage at the rate of the field frequency.

According to a further development of the invention, the reference values are represented by voltage values and a predetermined, adjustable or switchable biasing voltage is superposed on each voltage value to change the position of the reference values. Thus, the reference values can be taken in a simple way from an easily realizable calibrated voltage source.

A particularly simple and advantageous embodiment of the invention is obtained when the voltage values which are used as reference values are taken from the taps of a resistor chain whose ends always receive an adjustable or switchable voltage. This renders it possible to obtain, on the one hand, a simple, accurate and stable fixing of the reference values and, on the other hand, a likewise advantageous change in these reference values.

A particularly simple derivation of the reference values from a calibrated voltage source is obtained in accordance with an advantageous development of the invention in that further resistors are provided which are each connected by means of one of their terminals to one end of the resistor chain and by means of their other terminal to the voltages feeding the resistor chain, and that these resistors are of a switchable type. Switching the resistors is effected according to the invention at the field frequency rate.

DESCRIPTION OF THE DRAWINGS

The invention will now be described in greater detail by way of example with reference to the embodiments shown in the accompanying drawing, in which.

DESCRIPTION OF THE PREFERRED EMBODIMENT

Figure 1:
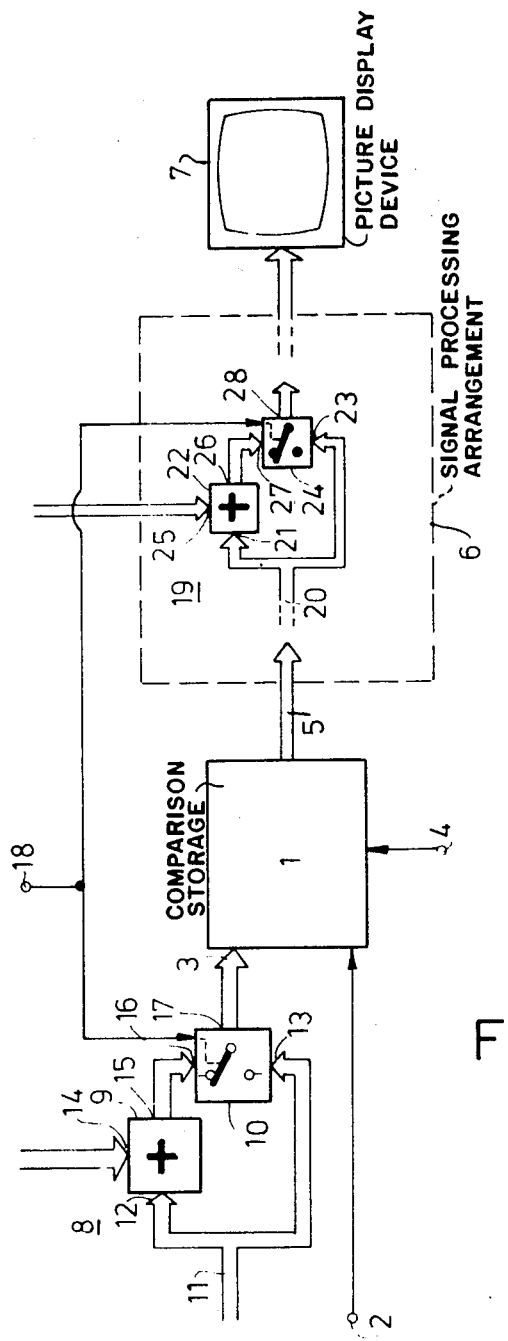
FIG. 1 shows a block diagram to explain the functional mode of a circuit arrangement according to the invention.

FIG. 1 shows a block diagram for a schematical illustration of the functional mode of a circuit arrangement according to the invention. A comparison stage 1 in the form of an analog-to-digital converter has a first input 2 to which an analog picture signal is applied. One or a plurality of reference values are applied to the comparison stage 1 via a second input 3 or a number of such inputs. In addition, the comparison stage 1 has an input 4 for receiving a sampling clock signal. The instantaneous value of the analog picture signal applied to the comparison stage 1 is compared at a repetition rate determined by the sampling clock signal to the reference value(s) applied to the input 3. The result of each comparison step is taken from the comparison stage 1 via an output 5 as a value of an amplitude-discrete intermediate signal and applied, via a signal processing arrangement 6, to a picture display device 7 in which the values of the intermediate signal are superimposed on an optical value which corresponds to a value of an amplitude-discrete output signal. The further signal processing operation includes, more specifically filtration, color splitting etc. If the amplitude-discrete intermediate signal is supplied in the form of a parallel binary word, the further signal processing operations are preferably effected in the digital mode.

To effect a change in the position of the reference values relative to the picture signal values between every two fields, the second input (or inputs) 3 of the comparison stage 1 are preceded by an arrangement 8 formed by a first adder device 9 and a first change-over device 10. The reference value(s) are applied to a first input 12 of the first adder device 9 via a conductor 11 and to a first input 13 of the first change-over device 13. A signal which determines the change in the position of the reference values is applied to the first adder device 9 via a second input 14. In the first adder device 9, this signal is added to the reference value(s) and conveyed to a second input 16 of the first change-over device 10 via an output 15 of the first adder device 9. The first change-over device 10 has furthermore an output 17 which is alternately connected to the first input 13 and to the second input 16 thereof at the rate of the field frequency. To that end, the first change-over device 13 is connected to a clock pulse conductor 18, which carries a clock signal of the field frequency, for example change-of-field pulses. In this way, the reference values are changed by the arrangement 8 for every second field in accordance with a signal applied to the second input of the first adder device 9. Consequently, the circuit arrangement described is preferably used for superposing two fields, but can alternatively also be used for the above-mentioned "averaging in the depth of the time".

In addition, for further signal processing, the circuit arrangement comprises, incorporated in the arrangement 6, an arrangement 19 whose mode of operation corresponds to that of the arrangement 8 and with which the value of the amplitude-discrete intermediate signal is influenced by a correction signal corresponding to the change in the reference values. To that end, the intermediate signal is applied via a conductor 20 to a first input 21 of a second adder device 22 and also to a first input 23 of a second change-over device 24. The correction signal is applied to a second input 25 of the second adder device 22. The intermediate signal on which the correction signal is impressed is available at the output 26 of the second adder device 22 and is applied to a second input 27 of the second change-over device 24. The second change-over device 24 further receives the clock signal of the field frequency via the clock pulse conductor 18, because of which its output 28 is alternately connected from field to field to its first input 23 and to its second input 27. In this way, an intermediate signal on which the correction signal is impressed is received for every second field and applied to the further signal processing arrangement 6 and, more specifically, to the picture display device 7.

The arrangement 19 for the superimposition of the correction signal may, in principle, be provided in any position in the amplitude-discrete intermediate signal path from the comparison stage 1 to the picture display device 7. Consequently, the amplitude-discrete intermediate signal can be corrected immediately after it has been produced but alternatively, subsequent to filtering, color splitting, etc.

The devices 8 and 19 for changing the reference values and for superimposing the correction signal may be in the form of analog or binary circuits. The arrangement 8 will, for example, be of an analog construction when the reference values of the comparison stage are applied in the analog form, and the arrangement 19 will be in the form of a binary circuit when the intermediate signals are in the form of parallel binary words. Instead of the arrangements 8 and 19 described, arrangements of a different construction may alternatively be used, particularly for the case of a multiple change of the position of the reference values. Thus, a clamping circuit may be used instead of the arrangement 19. The correction signal may be supplied in the form of predetermined values or directly from the field-frequency changes of the intermediate signal.

Figure 2:
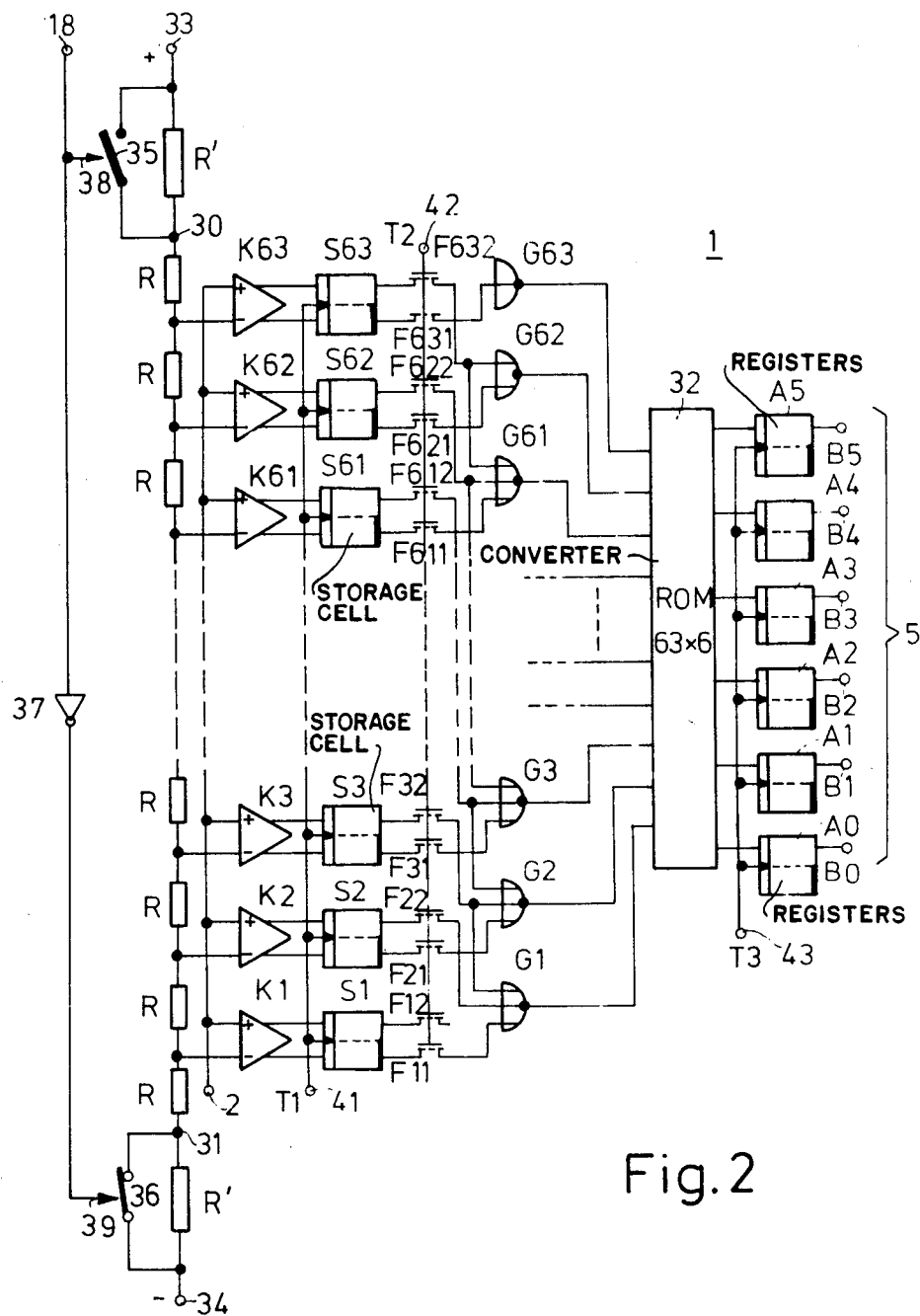
FIG. 2 shows a somewhat more detailed circuit diagram of a comparison stage and an arrangement for producing variable reference values.

FIG. 2 shows the block diagram of an embodiment of a comparison stage 1 which is in the form of a parallel analog-to-digital converter. This comparison stage 1 converts the instantaneous value of the analog picture signal applied to it via its first input 2, into a value of the amplitude-discrete intermediate signal supplied at the output 5 in the form of a six-bit parallel binary word. The comparison stage 1 comprises 63 comparators K1-K63, for example differential amplifiers, whose noninverting inputs are connected to the first input 2 for the analog picture signal. The inverting inputs of the comparators K1-K63 are sequentially connected to taps of a bleeder circuit formed by 64 identical resistors R, which bleeder chain has a first end 30 and a second end 31. At its taps, the bleeder chain supplies a plurality of equispaced reference values to which the analog picture signal applied via the input 2 is compared in the comparators K1-K63. Each comparator K1-K63 has two outputs, from which always the first output (the upper output in the drawing of FIG. 2) always produces a signal having the value one, when the instantaneous value of the analog picture signal exceeds the associated reference value, and of which the second output (the lower output in the drawing of FIG. 2) supplies a one-signal when the instantaneous value of the analog picture signal is less than the associated reference value.

The outputs of each of the comparators K1-K63 are connected to inputs of 63 storage cells S1-S63 in which the output signals produced by the comparators K1-K63 are stored until the moment at which a first sampling pulse T1 is applied to the control inputs of the storage cells, which inputs are jointly connected to a first sampling clock input 41. Consequently, the instantaneous value of the analog picture signal is stored in the storage cells S1-S63, such that at the instant determined by the sampling pulse T1 applied to the first sampling clock input 41, all the storage cells S1-S63 connected to comparators K1-K63 whose reference values exceed the instantaneous value of the analog picture signal are in a first storage state and all the other storage cells are in a second storage state. The storage cells S1-S63 supply in their first storage stage from their first output, the lower output as shown, a one-signal, while in their second storage, they supply from their second output, the upper output as shown, a one-signal.

The output signals of the storage cells S1-S63 are applied to inputs of a plurality of NOR-gates G1-G63 via field-effect transistors F11-F632, whose gate electrodes are connected to a second sampling clock pulse input 42. To that end, a second sampling pulse T2 which, on a time basis, follows after the first sampling pulse T1, is applied to the second sampling clock pulse input 42. The NOR-gates G1-G63 are connected to the outputs of the storage cells S1-S63 such that always only one of the outputs of the NOR-gates G1-G63 carries a one-signal, more specifically, the output of the NOR-gate assigned to the storage cell and consequently to the comparator whose associated reference value is smaller than the sampled instantaneous value of the analog picture signal. The outputs of the NOR-gates G1-G63 are connected to a converter 32, which has 6 outputs corresponding to the positions of a six-bit parallel binary word. Each of these outputs are connected to the input of one out of 6 output registers A0-A5. The converter 32 is constructed as a ROM, for example, in the form of a diode matrix having 63 inputs and 6 outputs, the parallel binary words supplied from the outputs forming a continuously increasing sequence of binary numbers, when signals are applied sequentially, one to each input, starting with the input connected to the NOR-gate G1 and ending with the input connected to the NOR-gate G63. Using a third sampling pulse T3, whose leading edge follows, on a time basis, after the leading edge of the second sampling pulse T2 and whose trailing edge preceeds, on a time basis, the trailing edge of the second sampling pulse, and which is applied to the third sampling clock pulse input 43, which connects all the control inputs of the output register A0-A5, the parallel binary word supplied by converter 32 is stored in the output registers A0-A5 and is then available as an amplitude-discrete intermediate signal at the outputs B0 to B5 thereof, which form the output 5 of the comparison stage 2.

To apply a switchable reference voltage to the ends 30 and 31 of the bleeder chain, these ends are connected to the terminals 33 and 34 of a reference voltage source via resistors R'. The resistors R' have, in the embodiment described here, a resistance value which is 2.5 times the resistance value of the resistors R of the bleeder chain, in accordance with which, a change in the reference values between every two fields by 2.5 times a value interval is effected. When different resistance values are chosen for R', changes in the reference values can also be accomplished in a simple way by any other values. The resistors R' can optionally by shunted by switching elements 35 and 36 arranged in parallel with them, such that always one of the switching elements 35, 36 is conductive and the other one is non-conductive. As a result thereof, in the present switching arrangement the reference values are shifted alternately 2.5 value intervals upwards and downwards. The switching elements are preferably in the form of semiconductor switches, for example, field-effect transistors. Their control terminals 38, 39 are interconnected via an inverter 37. The control terminal 38 of the switching element 35 is further connected to the clock pulse line 18 and receives the field-frequency clock signal via this line.

What is claimed is:

1. A method for converting an analog picture signal, corresponding to consecutive fields, into an amplitude-discrete output signal, comprising comparing the picture signal with a plurality of equispaced reference values having value intervals between them, producing from said comparison an amplitude-discrete intermediate signal which denotes the value interval in which the value of the picture signal is located, periodically changing the positions of the picture signal and the reference values relative to each other by a fraction of a value interval, and generating an amplitude-discrete output signal from an average value of the amplitude-discrete intermediate signal values of mutually corresponding picture elements, wherein the change in the position of the values of the picture signals relative to the reference values corresponds to the sum of the fraction and a first integral number of value intervals, characterized in that said method further comprises changing the value of the amplitude-discrete intermediate signal before the averaging operation is performed, by a value of an amplitude-discrete correction signal corresponding to the associated change in the relative positions of the picture signal and the reference values in the same direction as the change in the positions of the reference values relative to the picture signal.

2. The method as claimed in claim 1, characterized in that said method further comprises forming said amplitude-discrete correction signal from the change in the amplitude-discrete intermediate signal produced by the change in the relative positions of the picture signal and the reference values, and clamping the amplitude-discrete correction signal to the amplitude-discrete intermediate signal.

3. The method as claimed in claim 1, characterized in that the amplitude-discrete correction signal comprises a plurality of predetermined values corresponding to the change in the relative positions of the picture signal and the reference values, which are switched in accordance with this change.

4. The method as claimed in claim 1, 2 or 3, characterized in that, to change the position of the reference values and the picture signal relative to each other, said method further comprises superimposing a change signal, which alternates between two fields, on the picture signal.

5. The method as claimed in claim 4, characterized in that, in order to change the position of the reference values and the picture signal relative to each other, said method further comprises superimposing a change signal, which alternates between two fields, on the reference values.

6. The method as claimed in claim 5, characterized in that the reference values are represented by voltage values and that for changing the position of the reference values, said method comprises superimposing a predetermined, adjustable or switchable biasing voltage on each voltage value.

7. The method as claimed in claim 6, characterized in that the voltage values which serve as reference values are taken from taps of a bleeder chain whose ends are supplied with an adjustable or switchable voltage.

8. The method as claimed in claim 7, characterized in that resistors are provided which are each connected by means of one of their terminals to a respective one of the ends of the bleeder chain and by means of each of their other terminals to the voltages which feed the bleeder chain, the resistors being of a switchable type.

* * * * *